(12) United States Patent
Teng et al.

(10) Patent No.: US 11,107,950 B2
(45) Date of Patent: Aug. 31, 2021

(54) LIGHT EMITTING CHIP AND METHOD OF PRODUCING THE SAME

(71) Applicant: XIAMEN SAN'AN OPTOELECTRONICS CO., LTD., Fujian (CN)

(72) Inventors: Yu-Tsai Teng, Fujian (CN); Yan Feng, Fujian (CN); Shuo Yang, Fujian (CN); Chung-Ying Chang, Fujian (CN); Shutian Qiu, Fujian (CN)

(73) Assignee: Xiamen San'an Optoelectronics Co., Ltd., Fujian (CN)

( * ) Notice: Subject to any disclaimer, the term of this patent is extended or adjusted under 35 U.S.C. 154(b) by 44 days.

(21) Appl. No.: 16/747,244

(22) Filed: Jan. 20, 2020

(65) Prior Publication Data

US 2020/0152834 A1    May 14, 2020

Related U.S. Application Data

(63) Continuation-in-part of application No. PCT/CN2018/081672, filed on Apr. 3, 2018.

(30) Foreign Application Priority Data

Jul. 25, 2017   (CN) .......................... 201710610317.0

(51) Int. Cl.
*H01L 33/24*   (2010.01)
*H01L 25/075*  (2006.01)
*H01L 33/54*   (2010.01)

(52) U.S. Cl.
CPC .......... *H01L 33/24* (2013.01); *H01L 25/0753* (2013.01); *H01L 33/54* (2013.01); *H01L 2933/005* (2013.01); *H01L 2933/0033* (2013.01)

(58) Field of Classification Search
CPC ..... H01L 33/24; H01L 33/54; H01L 25/0753; H01L 2933/0033; H01L 2933/005; H01L 29/8613
(Continued)

(56) References Cited

U.S. PATENT DOCUMENTS 8,796,693 B2 *  8/2014  Richardson ......... H01L 21/0242
                                                         257/76
2014/0175452 A1 *  6/2014  Richardson ....... H01L 21/02458
                                                         257/76

FOREIGN PATENT DOCUMENTS

CN    104157765 A    11/2014
CN    104882523 A    9/2015

OTHER PUBLICATIONS

Search Report issued to PCT application No. PCT/CN2018/081672 by the CNIPA dated Jun. 20, 2018 (2 pages).

* cited by examiner

*Primary Examiner* — Igwe U Anya
(74) *Attorney, Agent, or Firm* — Michael Best & Friedrich LLP

(57) ABSTRACT

A light emitting chip includes a first-type semiconductor layer, a light emitting layer, and a second-type semiconductor layer which are disposed in such order, a passivation layer, and a current spreading layer. The second-type semiconductor layer and the light emitting layer cooperate to form a mesa structure which partially exposes the first-type semiconductor layer. The mesa structure has a lateral surface over which the passivation layer is disposed. The current spreading layer is disposed in contact with the second-type semiconductor layer. A distance between peripheries of a contact surface of the current spreading layer and a top surface of the second-type semiconductor layer is not greater than 5 μm. A method for producing the chip is also disclosed.

28 Claims, 6 Drawing Sheets

(58) Field of Classification Search
USPC .......................................................... 257/79
See application file for complete search history.

LIGHT EMITTING CHIP AND METHOD OF PRODUCING THE SAME

CROSS-REFERENCE TO RELATED APPLICATION

This application is a bypass continuation-in-part application of International Application No. PCT/CN2018/081672 filed on Apr. 3, 2018, which claims priority of Chinese Patent Application No. 201710610317.0, filed on Jul. 25, 2017. The entire content of each of the international and Chinese patent applications is incorporated herein by reference.

FIELD

The present disclosure relates to a semiconductor lighting element, and more particularly to a light emitting chip and a production method thereof.

BACKGROUND

In a conventional light emitting chip of a light emitting diode (LED), a transparent current spreading layer made from an indium tin oxide (ITO) material is disposed adjacent to a passivation layer and an electrically conductive semiconductor layer, and on a mesa structure composed of the semiconductor layer and having a lateral surface. However, undesired leakage of the ITO material of the current spreading layer to the lateral surface of the mesa structure might occur, leading to electric leakage of the light emitting diode.

SUMMARY

Therefore, an object of the present disclosure is to provide a light emitting chip and a production method thereof that can alleviate at least one of the drawbacks of the prior art.

The light emitting chip includes an electrically conductive first-type semiconductor layer, a light emitting layer, an electrically conductive second-type semiconductor layer, a passivation layer, and a transparent current spreading layer. The light emitting layer is disposed on an upward surface of the first-type semiconductor layer, and has opposite upper and lower surfaces that are distal from and proximal to the upward surface of the first-type semiconductor layer, respectively. The second-type semiconductor layer is disposed on the upper surface of the light emitting layer, and has opposite top and bottom surfaces that are distal from and proximal to the upper surface of the light emitting layer, respectively. The second-type semiconductor layer and the light emitting layer cooperate to form a mesa structure which partially exposes the upward surface of the first-type semiconductor layer. The mesa structure has a lateral surface that extends from the lower surface of the light emitting layer to the top surface of said second-type semiconductor layer. The passivation layer is disposed over the lateral surface of the mesa structure. The current spreading layer is disposed on the top surface of the second-type semiconductor layer, and has a contact surface in contact with the top surface of the second-type semiconductor layer. A distance between a periphery of the contact surface of the current spreading layer and a periphery of the top surface of the second-type semiconductor layer is not greater than 5 μm.

The method includes the following steps. An epitaxial structure is provided, and includes an electrically conductive first-type semiconductor layer, a light emitting layer, and an electrically conductive second-type semiconductor layer. The light emitting layer is disposed on an upward surface of the first-type semiconductor layer, and has opposite upper and lower surfaces that are distal from and proximal to the upward surface of the first-type semiconductor layer, respectively. The second-type semiconductor layer is disposed on the upper surface of the light emitting layer, and has opposite top and bottom surfaces that are distal from and proximal to the upper surface of the light emitting layer, respectively. The second-type semiconductor layer and the light emitting layer are subjected to a mesa forming process, such that the second-type semiconductor layer and the light emitting layer cooperate to form a mesa structure which partially exposes the upward surface of the first-type semiconductor layer. The mesa structure has a lateral surface that extends from the lower surface of the light emitting layer to the top surface of the second-type semiconductor layer. A passivation layer is formed over the lateral surface of the mesa structure. A transparent current spreading layer is formed on the top surface of the second-type semiconductor layer. The current spreading layer has a contact surface in contact with the top surface of the second-type semiconductor layer. A distance between a periphery of the contact surface of the current spreading layer and a periphery of the top surface of the second-type semiconductor layer is not greater than 5 μm.

BRIEF DESCRIPTION OF THE DRAWINGS

Other features and advantages of the present disclosure will become apparent in the following detailed description of the embodiment with reference to the accompanying drawings, of which.

DETAILED DESCRIPTION

Figure 1:
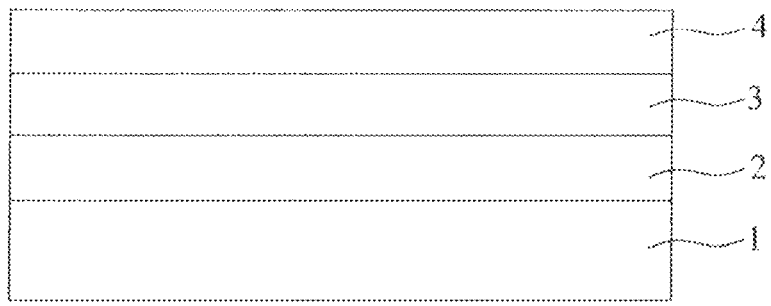
FIG. 1 is a schematic sectional view illustrating step 1 of a first embodiment of a production method, which is for producing a first embodiment of a light emitting chip, according to the present disclosure.

Before the present disclosure is described in greater detail, it should be noted that where considered appropriate, reference numerals or terminal portions of reference numerals have been repeated among the figures to indicate corresponding or analogous elements, which may optionally have similar characteristics.

Figure 4:
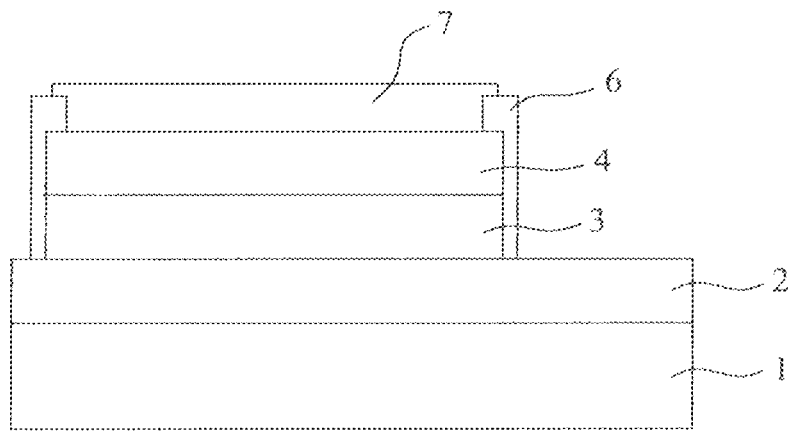
FIG. 4 is a schematic sectional view illustrating step 4 of the first embodiment of the production method and the first embodiment of the light emitting chip produced thereby.

Referring to FIG. 4, a first embodiment of a light emitting chip according to the present disclosure includes a substrate 1, an electrically conductive first-type semiconductor layer 2, a light emitting layer 3, an electrically conductive second-type semiconductor layer 4, a passivation layer 6, and a transparent current spreading layer 7.

The term "first-type" refers to being doped with a first conductivity type dopant, and the term "second-type" refers to being doped with a second conductivity type dopant that is opposite in conductivity type to the first conductivity type dopant. For instance, the first conductivity type dopant may be an n-type dopant, and the second conductivity type dopant may be a p-type dopant, and vice versa.

The first-type semiconductor layer 2 is disposed on the substrate 1, and has an upward surface facing away from the substrate 1.

The light emitting layer 3 is disposed on the upward surface of the first-type semiconductor layer 2, and has opposite upper and lower surfaces that are distal from and proximal to the upward surface of the first-type semiconductor layer 2, respectively.

The second-type semiconductor layer 4 is disposed on the upper surface of the light emitting layer 3, and has opposite top and bottom surfaces that are distal from and proximal to the upper surface of the light emitting layer 3, respectively. The second-type semiconductor layer 4 and the light emitting layer 3 cooperate to form a mesa structure which partially exposes the upward surface of the first-type semiconductor layer 2, The mesa structure has a lateral surface 5 that extends from the lower surface of the light emitting layer 3 to the top surface of the second-type semiconductor layer 4 (see FIG. 2, where a part of the lateral surface 5 is circled).

The passivation layer 6 is disposed over the lateral surface 5 of the mesa structure. The passivation layer 6 aims to prevent leakage of electrically conductive materials which might cause short circuiting of a light emitting device. In this embodiment, the passivation layer 6 is further disposed on the top surface of the second-type semiconductor layer 4, and has a contact surface in contact with the top surface of the second-type semiconductor layer 4. A distance between a periphery of the contact surface of the passivation layer 6 and a periphery of the top surface of the second-type semiconductor layer 4 may be not greater than 2 µm. Alternatively, the passivation layer 6 may be not disposed on the top surface of the second-type semiconductor layer 4, hence lacking the aforesaid contact surface (see, for instance, the passivation layer 6 in FIGS. 8 and 9).

The current spreading layer 7 is disposed on the top surface of the second-type semiconductor layer 4 and on the passivation layer 6, and has a contact surface in contact with the top surface of the second-type semiconductor layer 4. A distance between a periphery of the contact surface of the current spreading layer 7 and the periphery of the top surface of the second-type semiconductor layer 4 is not greater than 5 µm. In this embodiment, such distance is not equal to 0 µm (i.e. the contact surface of the current spreading layer 7 does not cover the entire top surface of the second-type semiconductor layer 4). In other embodiment, such distance may be equal to 0 µm (i.e. the contact surface of the current spreading layer 7 covers the entire top surface of the second-type semiconductor layer 4), so that the current spreading layer 7 may more satisfactorily (e.g. more uniformly) distribute a current on the second-type semiconductor layer 4.

A first embodiment of a production method according to the present disclosure, which is used to produce the first embodiment of the light emitting chip, includes steps 1 to 4 described below.

In step 1, referring to FIG. 1, an epitaxial structure is provided. The epitaxial structure includes the substrate 1, the first-type semiconductor layer 2, the light emitting layer 3, and the second-type semiconductor layer 4. The first-type semiconductor layer 2, the light emitting layer 3, and the second-type semiconductor layer 4 are sequentially disposed on the substrate 1 as described above, except that the aforesaid mesa structure has not been formed yet in step 1.

Figure 2:
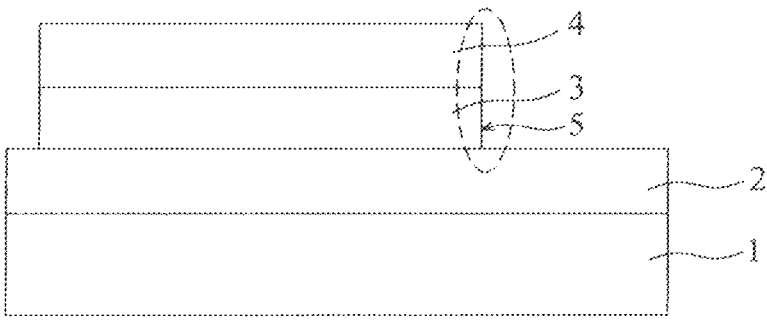
FIG. 2 is a schematic sectional view illustrating step 2 of the first embodiment of the production method.

In step 2, referring to FIG. 2, the second-type semiconductor layer 4 and the light emitting layer 3 are subjected to a mesa forming process, such that the second-type semiconductor layer 4 and the light emitting layer 3 cooperate to form the mesa structure described above, and such that the upward surface of the first-type semiconductor layer 2 has an electrode placement portion. Since the mesa forming process (e.g. etching, laser ablation, imprint lithography, etc.) can be conducted using technique well-known to and commonly used by those skilled in the art, the same is omitted herein for the sake of brevity.

Figure 3:
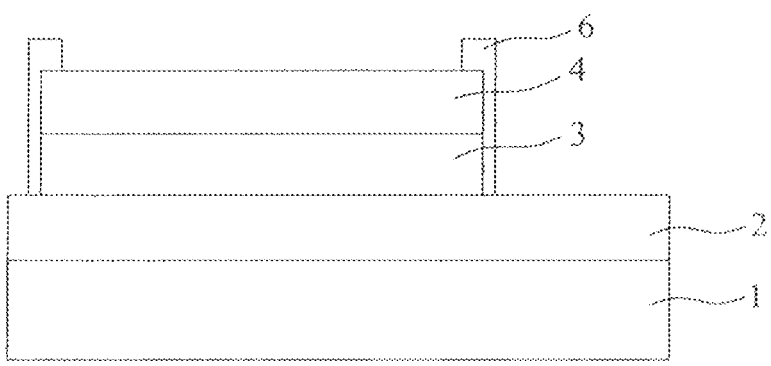
FIG. 3 is a schematic sectional view illustrating step 3 of the first embodiment of the production method.

In step 3, referring to FIG. 3, the passivation layer 6 is formed over the lateral surface 5 of the mesa structure.

In step 4, referring to FIG. 4, the current spreading layer 7 is formed on the top surface of the second-type semiconductor layer 4 and on the passivation layer 6.

After step 4, an electrode may be formed on the current spreading layer 7. Optionally, another electrode may be formed on the electrode placement portion of the upward surface of the first-type semiconductor layer 2.

Before describing additional embodiments, it should be noted that FIGS. 5 to 12 only serve to illustrate a feature or more of one of the additional embodiments below, not all features of any one of the additional embodiments below.

A second embodiment of the light emitting chip according to the present disclosure is generally similar to the first embodiment of the light emitting chip, except for the following differences.

Figure 7:
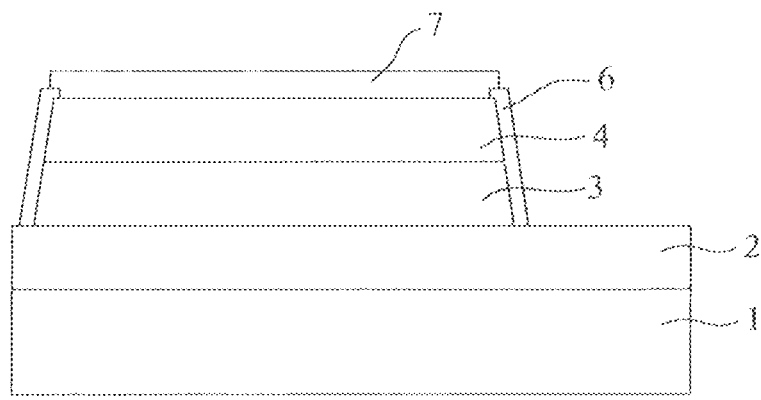
FIG. 7 is a schematic sectional view illustrating that the passivation layer is disposed in contact with a top surface of a second-type semiconductor layer of the mesa structure.
Figure 8:
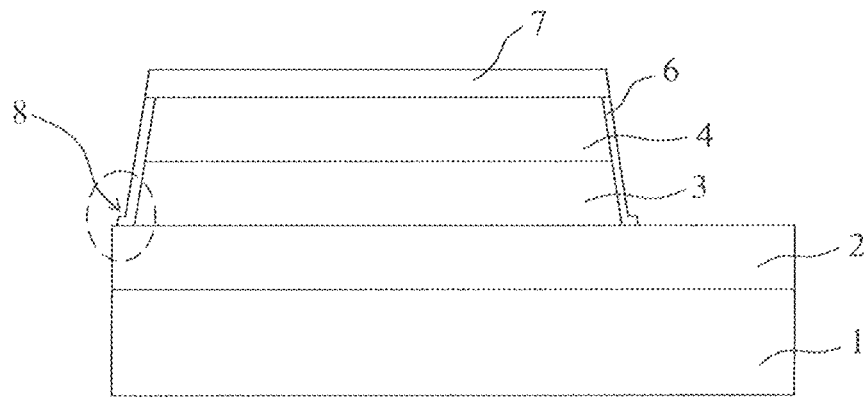
FIG. 8 is a schematic sectional view illustrating that the passivation layer is not disposed in contact with the top surface of the second-type semiconductor layer of the mesa structure.
Figure 9:
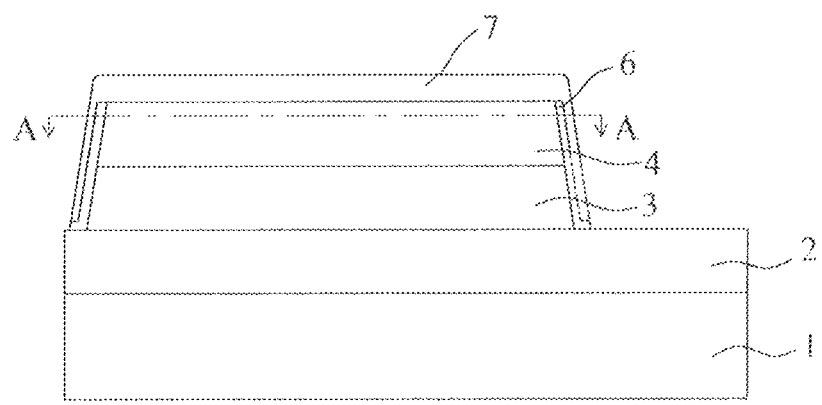
FIG. 9 is a schematic sectional view illustrating that a transparent current spreading layer is disposed over the passivation layer.

In the second embodiment, the lateral surface 5 of the mesa structure is inclined relative to the upward surface of the first-type semiconductor layer 2 (see, for example, the lateral surface 5 in FIGS. 7, 8, and 9). An included angle between the lateral surface 5 of the mesa structure and an imaginary plane perpendicular to the upward surface of the first-type semiconductor layer 2 ranges from 5° to 15°. Under such circumstance, the passivation layer 6 may be more uniformly distributed on the inclined lateral surface 5 compared to the vertical lateral surface 5, thereby more satisfactorily preventing short circuiting.

Figure 5:
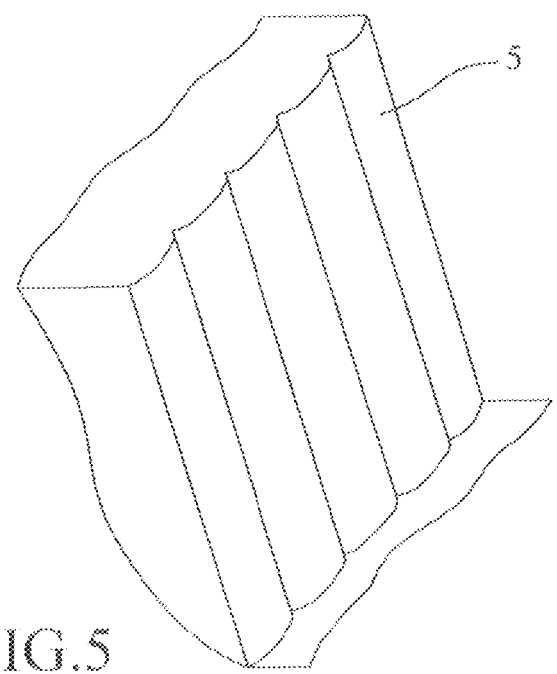
FIG. 5 is a fragmentary schematic perspective view illustrating that a lateral surface of a mesa structure has a pattern.
Figure 6:
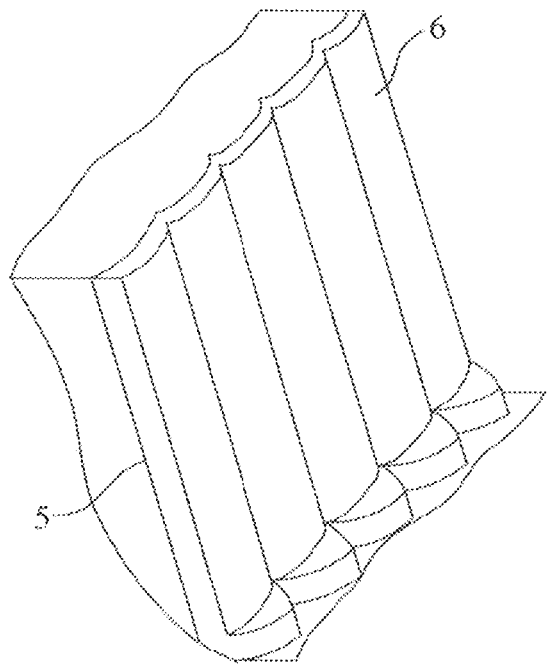
FIG. 6 is a fragmentary schematic perspective view illustrating that a passivation layer is disposed over the patterned lateral surface of the mesa structure.

In the second embodiment, the lateral surface 5 of the mesa structure may have a pattern (see, for instance, the lateral surface 5 in FIG. 5), and the passivation layer 6 disposed over the lateral surface 5 may also have a pattern (see, for instance, the passivation layer 6 in FIG. 6). Alternatively, both the lateral surface 5 of the mesa structure and the passivation layer 6 may have no pattern (see, for instance, the lateral surface 5 and the passivation layer 6 in FIGS. 11 and 12).

In the second embodiment, the current spreading layer 7 may be disposed at least over a portion of the passivation layer 6 that corresponds in position to the light emitting layer 3. The current spreading layer 7 may be disposed over both the portion of the passivation layer 6 that corresponds in position to the light emitting layer 3, and a portion of the passivation layer 6 that corresponds in position to the second-type semiconductor layer 4 (see, for example, the current spreading layer 7 in FIGS. 9 and 12).

Figure 10:
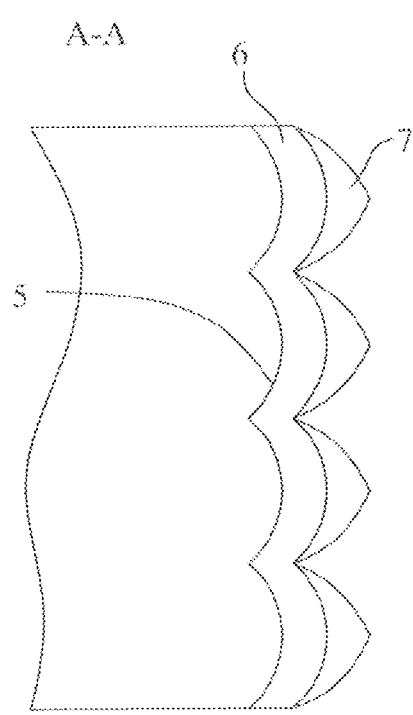
FIG. 10 is a fragmentary schematic sectional view taken along line A-A in FIG. 9.

When the passivation layer 6 has a pattern, the current spreading layer 7 disposed thereover also may have a pattern (see, for example, the current spreading layer 7 in FIG. 10). However, when the lateral surface 5 of the mesa structure and the passivation layer 6 have no pattern, the current spreading layer 7 disposed over the passivation layer 6 may still have a pattern. For instance, as shown in FIG. 12, the current spreading layer 7 may have spaced-apart extended coverage portions that protrude from the passivation layer 6 and that are in the form of light-guiding ridges, while the lateral surface 5 of the mesa structure and the passivation layer 6 have no pattern.

Figure 11:
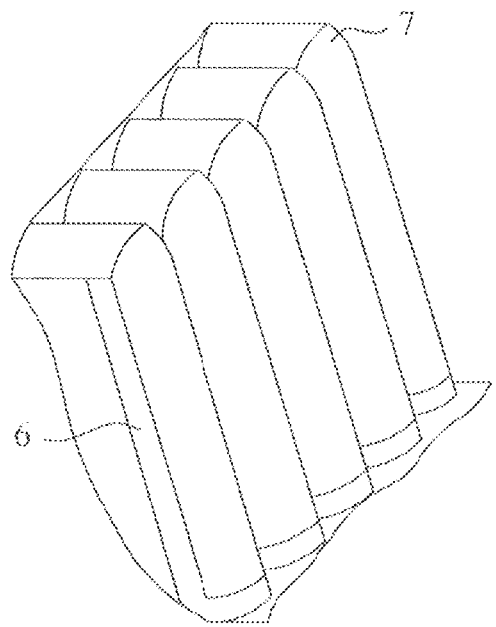
FIG. 11 is a fragmentary schematic perspective view illustrating that the current spreading layer disposed over the passivation layer has a pattern.
Figure 12:
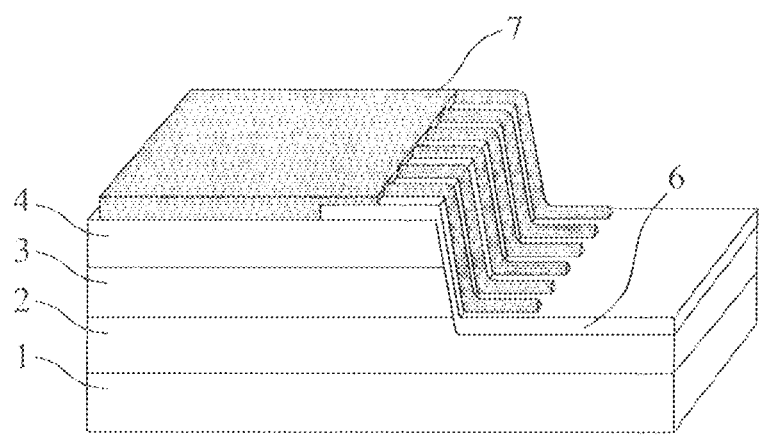
FIG. 12 is a schematic perspective view illustrating that the current spreading layer has spaced-apart ridges which protrude from the passivation layer.

The pattern of the lateral surface 5 of the mesa structure, the passivation layer 6, and the current spreading layer 7, if any, may include connected pattern elements (see the lateral surface 5 in FIG. 5, the passivation layer 6 in FIG. 6, and the current spreading layer 7 in FIG. 11) or spaced apart pattern elements (see the current spreading layer 7 in FIGS. 10 and 12). The aforesaid spaced-apart extended coverage portions of the current spreading layer 7 (see FIG. 12) are an example of the spaced apart pattern elements, and connected extended coverage portions of the current spreading layer 7 disposed over the passivation layer 6 (see FIG. 11) are an example of the connected pattern elements.

Referring to FIG. 11, when the current spreading layer 7 has the pattern elements shown therein, the current spreading layer 7 has a refractive index smaller than that of the passivation layer 6, and the passivation layer 6 has a refractive index smaller than that of one of the first-type semiconductor layer 2, the second-type semiconductor layer 4, and the light emitting layer 3. Therefore, the pattern elements of the current spreading layer 7 can serve as light guiding elements that reduce absorbance of light resulting from total reflection to increase light emission in a direction perpendicular to the top surface of the second-type semiconductor layer 4 so as to improve the light extraction efficiency of the light emitting chip.

A second embodiment of the production method according to the present disclosure, which is used to produce the second embodiment of the light emitting chip, is generally similar to the first embodiment of the production method, except for the following differences.

In the second embodiment of the production method, specifically in step 2, the inclined lateral surface 5 of the mesa structure may be formed with a pattern as described above or subsequently subjected to patterning to have a pattern as described above (see, for example, the inclined lateral surface 5 in FIG. 5).

In the second embodiment of the production method, specifically in step 3, the passivation layer 6 is formed through atomic layer deposition on the inclined lateral surface 5 of the mesa structure (see, for instance, the passivation layer 6 in FIG. 6). The passivation layer 6 has a thickness ranging from 0.1 nm to 250 nm. Since the passivation layer 6 formed through atomic layer deposition can have a satisfactorily small thickness, the light extraction efficiency of the light emitting chip can be enhanced. Furthermore, the passivation layer 6 formed through atomic layer deposition can be distributed more uniformly and have more satisfactory adhesion.

In the second embodiment of the production method, specifically in step 4, the current spreading layer 7 is formed over the passivation layer 6.

A third embodiment of the light emitting chip according to the present disclosure is generally similar to the second embodiment of the light emitting chip, except for the following difference.

In the third embodiment, only one of the lateral surface 5 of the mesa structure and the passivation layer 6 may have a pattern (not shown in the drawings). When the lateral surface 5 of the mesa structure has no pattern and the passivation layer 6 disposed over the non-patterened lateral surface 5 has a pattern (not shown in the drawings), the current spreading layer 7 disposed over the patterned passivation layer 6 may also have a pattern.

A third embodiment of the production method according to the present disclosure, which is used to produce the third embodiment of the light emitting chip, is generally similar to the second embodiment of the production method, except for the following difference.

In the third embodiment of the production method, specifically in step 3, the passivation layer 6 may be directly formed over the non-patterned lateral surface 5 of the mesa structure, and may be formed with a pattern or subsequently subjected to patterning to have a pattern. In step 4, when the current spreading layer 7 is formed over the patterned passivation layer 6, the current spreading layer 7 may be formed with a pattern or subsequently subjected to patterning to have a pattern.

A fourth embodiment of the light emitting chip according to the present disclosure is generally similar to the first embodiment of the light emitting chip or the second embodiment of the light emitting chip, except for the following differences.

In the fourth embodiment, the distance between the periphery of the contact surface of the current spreading layer 7 and the periphery of the top surface of the second-type semiconductor layer 4 may be not greater than 2 µm. Furthermore, the current spreading layer 7 may have a non-contact surface that is opposite to the contact surface and that extends longitudinally to terminate at at least one terminal end exceeding the periphery of the top surface of the second-type semiconductor layer 4 (see, for instance, the current spreading layer 7 in FIGS. 7, 8, and 9). In addition, the current spreading layer 7 has a thickness ranging from 10 nm to 200 nm, thereby enhancing the light extraction efficiency of the light emitting chip.

In the fourth embodiment, the passivation layer 6 has a thickness ranging from 5 nm to 250 nm. The current spreading layer 7 may be not disposed on the passivation layer 6 (not shown in the drawings). When the current spreading layer 7 is not disposed on the passivation layer 6, the current spreading layer 7 may be spaced apart from or in contact with the passivation layer 6.

A fifth embodiment of the light emitting chip according to the present disclosure is generally similar to the second embodiment of the light emitting chip and the fourth embodiment of the light emitting chip, except for the following differences.

In the fifth embodiment, the passivation layer 6 has a thickness ranging from 0.1 nm to 200 nm. The passivation layer 6 may be disposed over a portion of the upward surface of the first-type semiconductor layer 2 (see, for instance, the passivation layer 6 in FIG. 7) to prevent leakage of the material of the current spreading layer 7 which might cause short circuiting.

In the fifth embodiment, each of the lateral surface 5 of the mesa structure, the passivation layer 6, and the current spreading layer 7 may have no pattern.

A sixth embodiment of the light emitting chip according to the present disclosure is generally similar to the fifth embodiment of the light emitting chip, except for the following differences.

In the sixth embodiment, the lateral surface 5 of the mesa structure has a wave pattern (see, for example, the lateral surface 5 in FIG. 10). The passivation layer 6 disposed over the patterned lateral surface 5 and the current spreading layer 7 disposed over the passivation layer 6 both may have pattern elements that are in the form of ridges (not shown in the drawings). Each of such ridges may have a cross-sectional shape selected from a triangular shape, an arc shape, a trapezoidal shape, a regular quadrilateral shape, a hemispherical shape, and a hemi-elliptical shape. A distance between two adjacent ones of the ridges of the current spreading layer 7 may range from 100 nm to 1000 nm.

In the sixth embodiment, the current spreading layer is made from a material selected from the group consisting of ITO, ZnO, and a combination thereof, and the passivation layer 6 is made from a material selected from the group consisting of $SiO_2$, AlN, $Al_2O_3$, and combinations thereof.

A seventh embodiment of the light emitting chip according to the present disclosure is generally similar to the fifth embodiment of the light emitting chip, except for the following difference.

In the previous embodiments, the pattern of the lateral surface 5 of the mesa structure, that of the passivation layer 6, and/or that of the current spreading layer 7 are(is) formed adjacent to the electrode placement portion of the upward surface of the first-type semiconductor layer 2. However, in the seventh embodiment, the lateral surface 5 of the mesa structure, the passivation layer 6, and the current spreading layer 7 may have a pattern adjacent to a non-electrode placement portion 8 of the upward surface of the first-type semiconductor layer 2 (see FIG. 8 where the non-electrode placement portion 8 is circled).

Since formation of a pattern can be conducted using technique well-known to and commonly used by those skilled in the art, the same is omitted herein for the sake of brevity.

The advantage of the light emitting chip of the present disclosure resides in that not only the current spreading layer 7 can be sufficiently distributed on the top surface of the second-type semiconductor layer 4 of the mesa structure, but also the passivation layer 6 disposed over the lateral surface 5 of the mesa structure can prevent leakage of the material of the current spreading layer 7 to further protect the light emitting chip against electric leakage.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting chip comprising:
an electrically conductive first-type semiconductor layer;
a light emitting layer disposed on an upward surface of said first-type semiconductor layer, and having opposite upper and lower surfaces that are distal from and proximal to said upward surface of said first-type semiconductor layer, respectively;
an electrically conductive second-type semiconductor layer disposed on said upper surface of said light emitting layer, and having opposite top and bottom surfaces that are distal from and proximal to said upper surface of said light emitting layer, respectively, said second-type semiconductor layer and said light emitting layer cooperating to form a mesa structure which partially exposes said upward surface of said first-type semiconductor layer, said mesa structure having a lateral surface that extends from said lower surface of said light emitting layer to said top surface of said second-type semiconductor layer;
a passivation layer disposed over said lateral surface of said mesa structure; and
a transparent current spreading layer disposed on said top surface of said second-type semiconductor layer, and having a contact surface in contact with said top surface of said second-type semiconductor layer,
wherein a distance between a periphery of said contact surface of said current spreading layer and a periphery of said top surface of said second-type semiconductor layer is not greater than 5 μm.

2. The light emitting chip as claimed in claim 1, wherein said current spreading layer has a non-contact surface that is opposite to said contact surface and that extends longitudinally to terminate at at least one terminal end exceeding said periphery of said top surface of said second-type semiconductor layer.

3. The light emitting chip as claimed in claim 1, wherein said lateral surface of said mesa structure is inclined relative to said upward surface of said first-type semiconductor layer.

4. The light emitting chip as claimed in claim 3, wherein an included angle between said lateral surface of said mesa structure and an imaginary plane perpendicular to said upward surface of said first-type semiconductor layer ranges from 5° to 15°.

5. The light emitting chip as claimed in claim 1, wherein said current spreading layer is further disposed on said passivation layer.

6. The light emitting chip as claimed in claim 5, wherein said current spreading layer is disposed at least over a portion of said passivation layer that corresponds in position to said light emitting layer.

7. The light emitting chip as claimed in claim 5, wherein said current spreading layer has extended coverage portions in contact with and disposed over said passivation layer.

8. The light emitting chip as claimed in claim 7, wherein said extended coverage portions of said current spreading layer are connected with one another.

9. The light emitting chip as claimed in claim 7, wherein said extended coverage portions of said current spreading layer are spaced apart from one another.

10. The light emitting chip as claimed in claim 9, wherein said extended coverage portions of said current spreading layer are ridges that protrude from said passivation layer.

11. The light emitting chip as claimed in claim 10, wherein said extended coverage portions of said current spreading layer are light-guiding ridges.

12. The light emitting chip as claimed in claim 10, wherein each of said ridges has a cross-sectional shape selected from a triangular shape, an arc shape, a trapezoidal shape, a regular quadrilateral shape, a hemispherical shape, and a hemi-elliptical shape.

13. The light emitting chip as claimed in claim 9, wherein a distance between two adjacent ones of said extended coverage portions of said current spreading layer ranges from 100 nm to 1000 nm.

14. The light emitting chip as claimed in claim 5, wherein said upward surface of said first-type semiconductor layer has a non-electrode placement portion.

15. The light emitting chip as claimed in claim 1, wherein said passivation layer is further disposed on said top surface of said second-type semiconductor layer, and has a contact surface in contact with said top surface of said second-type semiconductor layer, a distance between a periphery of said contact surface of said passivation layer and said periphery of said top surface of said second-type semiconductor layer being not greater than 2 μm.

16. The light emitting chip as claimed in claim 1, wherein the distance between said periphery of said contact surface of said current spreading layer and said periphery of said top surface of said second-type semiconductor layer is not greater than 2 μm.

17. The light emitting chip as claimed in claim 1, wherein said current spreading layer has a thickness ranging from 10 nm to 200 nm.

18. The light emitting chip as claimed in claim 1, wherein said passivation layer has a thickness ranging from 0.1 nm to 250 nm.

19. The light emitting chip as claimed in claim 1, wherein said current spreading layer has a refractive index smaller than that of said passivation layer, said passivation layer having a refractive index smaller than that of one of said first-type semiconductor layer, said second-type semiconductor layer, and said light emitting layer.

20. The light emitting chip as claimed in claim 1, wherein said current spreading layer is made from a material selected from the group consisting of ITO, ZnO, and a combination thereof, and said passivation layer is made from a material selected from the group consisting of $SiO_2$, AlN, $Al_2O_3$, and combinations thereof.

21. A method for producing a light emitting chip, comprising:
  providing an epitaxial structure that includes an electrically conductive first-type semiconductor layer, a light emitting layer, and an electrically conductive second-type semiconductor layer, the light emitting layer being disposed on an upward surface of the first-type semiconductor layer, and having opposite upper and lower surfaces that are distal from and proximal to the upward surface of the first-type semiconductor layer, respectively, the second-type semiconductor layer being disposed on the upper surface of the light emitting layer, and having opposite top and bottom surfaces that are distal from and proximal to the upper surface of the light emitting layer, respectively;
  subjecting the second-type semiconductor layer and the light emitting layer to a mesa forming process, such that the second-type semiconductor layer and the light emitting layer cooperate to form a mesa structure which partially exposes the upward surface of the first-type semiconductor layer, the mesa structure having a lateral surface that extends from the lower surface of the light emitting layer to the top surface of the second-type semiconductor layer;
  forming a passivation layer over the lateral surface of the mesa structure; and
  forming a transparent current spreading layer on the top surface of the second-type semiconductor layer, the current spreading layer having a contact surface in contact with the top surface of the second-type semiconductor layer,
  wherein a distance between a periphery of the contact surface of the current spreading layer and a periphery of the top surface of the second-type semiconductor layer is not greater than 5 μm.

22. The method as claimed in claim 21, wherein the lateral surface of the mesa structure is inclined relative to the upward surface of the first-type semiconductor layer, an included angle between the lateral surface of the mesa structure and an imaginary plane perpendicular to the upward surface of the first-type semiconductor layer ranging from 5° to 15°.

23. The method as claimed in claim 21, wherein the passivation layer is formed through atomic layer deposition.

24. The method as claimed in claim 21, wherein the current spreading layer has a refractive index smaller than that of the passivation layer, the passivation layer having a refractive index smaller than that of one of the first-type semiconductor layer, the second-type semiconductor layer, and the light emitting layer.

25. The method as claimed in claim 21, wherein, after formation of the mesa structure, the lateral surface of the mesa structure is subjected to patterning.

26. The method as claimed in claim 21, wherein the passivation layer is further formed on the top surface of the second-type semiconductor layer, and has a contact surface in contact with the top surface of the second-type semiconductor layer, a distance between a periphery of the contact surface of the passivation layer and the periphery of the top surface of the second-type semiconductor layer being not greater than 2 μm.

27. The method as claimed in claim 21, wherein the passivation layer is subjected to patterning before formation of the current spreading layer.

28. The method as claimed in claim 21, wherein the current spreading layer is formed to have extended coverage portions in contact with and disposed over the passivation layer, the extended coverage portions of the current spreading layer being ridges that protrude from the passivation layer, and that are spaced apart from one another.

* * * * *